United States Patent
LeToux

(10) Patent No.: US 7,692,514 B2
(45) Date of Patent: Apr. 6, 2010

(54) LINEAR ANTENNA SWITCH ARM

(75) Inventor: Thomas LeToux, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 261 days.

(21) Appl. No.: 11/769,938

(22) Filed: Jun. 28, 2007

(65) Prior Publication Data

US 2008/0042913 A1   Feb. 21, 2008

(30) Foreign Application Priority Data

Jun. 28, 2006   (GB) .................................. 0612755.9

(51) Int. Cl.
*H01P 1/15* (2006.01)
*H01P 1/10* (2006.01)
(52) U.S. Cl. ...................... 333/101; 333/103
(58) Field of Classification Search ................ 333/101, 333/103, 104, 262
See application file for complete search history.

(56) References Cited

U.S. PATENT DOCUMENTS

| 6,218,890 | B1 | 4/2001 | Yamaguchi et al. |
| 7,459,988 | B1 * | 12/2008 | Iversen ........................ 333/103 |
| 2005/0079829 | A1 | 4/2005 | Ogawa et al. |
| 2005/0263799 | A1 | 12/2005 | Nakatsuka et al. |
| 2006/0118951 | A1 | 6/2006 | Ogawa et al. |
| 2006/0252394 | A1 | 11/2006 | Suwa et al. |
| 2006/0261912 | A1 | 11/2006 | Miyagi et al. |
| 2007/0049237 | A1 | 3/2007 | Miura et al. |

FOREIGN PATENT DOCUMENTS

EP    1487103    12/2004

OTHER PUBLICATIONS

Search Report for Application No. GB0612755.9, date of search Oct. 4, 2007.

* cited by examiner

*Primary Examiner*—Dean O Takaoka
(74) *Attorney, Agent, or Firm*—Withrow & Terranova, P.L.L.C.

(57) ABSTRACT

A linear antenna switch arm comprising
a plurality of field effect transistors connected in series, the drain of each transistor being connected to the source of the next transistor at a join, the end source comprising one of a signal input or output port and the end drain comprising the complementary signal output port or input port;
a signal line extending between the input and output ports;
at least one of the joins being connected to the signal line at a node by a connection line;
the signal line comprising at least one resistor between signal input and output ports; and
the connection line comprising at least one resistor.

11 Claims, 7 Drawing Sheets

LINEAR ANTENNA SWITCH ARM

The subject patent application claims priority to and all the benefits of United Kingdom Patent Application No. 0612755.9, which was filed on 28 Jun. 2006 with The UK Patent Office.

The present invention relates to a linear antenna switch arm. More particularly, but not exclusively, the present invention relates to a linear antenna switch arm comprising a plurality of FETs connected in series and having a resistor between input and output and at least one join node path having at least one resistor.

Antenna switches are used in applications requiring a time division multiple access method, for example GSM and UMTS cellular phones. Series shunt configurations are often used, with a single pole and several throws, the series devices connecting alternatively either of a receive or transmit port to the single pole, and the shunt devices isolating the non-used ports. Field effect transistors are used to realise the series or shunt devices, the input being the drain and the output the source, or vice-versa. The signal passes through the conductive channel.

When reaching the single pole, the signal "sees" one or several OFF arms in parallel. In order to transmit high power signals such as GSM at its nominal maximum power and in order to maintain a low bias voltage to drive the switch, the voltage swing present at the pole must not turn on the FET present in the OFF arm. Several FETs are therefore used in series in order to spread the high voltage across a high number of junctions and the junctions are kept at a floating bias.

However, each of the FETs constituting the OFF arm can be modelled by a highly non linear shunt capacitance, thus introducing non linearities in the switched signal.

The present invention seeks to overcome this problem.

Accordingly, the present invention provides a linear antenna switch arm comprising
a plurality of field effect transistors connected in series, the drain of each transistor being connected to the source of the next transistor at a join, the end source comprising one of a signal input or output port and the end drain comprising the complementary signal output port or input port;
a signal line extending between the input and output ports;
at least one of the joins being connected to the signal line at a node by a connection line;
the signal line comprising at least one resistor between signal input and output ports; and
the connection line comprising at least one resistor.

The linear antenna switch arm is significantly more linear than known antenna switch arms.

Preferably, a plurality of joins are connected to the signal line at nodes by connection lines, each connection line including a resistor.

Adjacent nodes can be electrically shorted together by the signal line.

The signal line can comprise a resistor between signal input port and the first node in the signal line.

The signal line can comprise a resistor between signal output port and last node in the signal line.

At least one of the connection lines can comprise a diode.

The signal line can further comprise at least one diode.

Preferably, the gates of the field effect transistors are connected to a control line by resistors.

The present invention will now be described by way of example, only and not in any limitative sense, with reference to the accompanying drawings in which FIG. 1 shows a known antenna switch arm;

Figure 1:
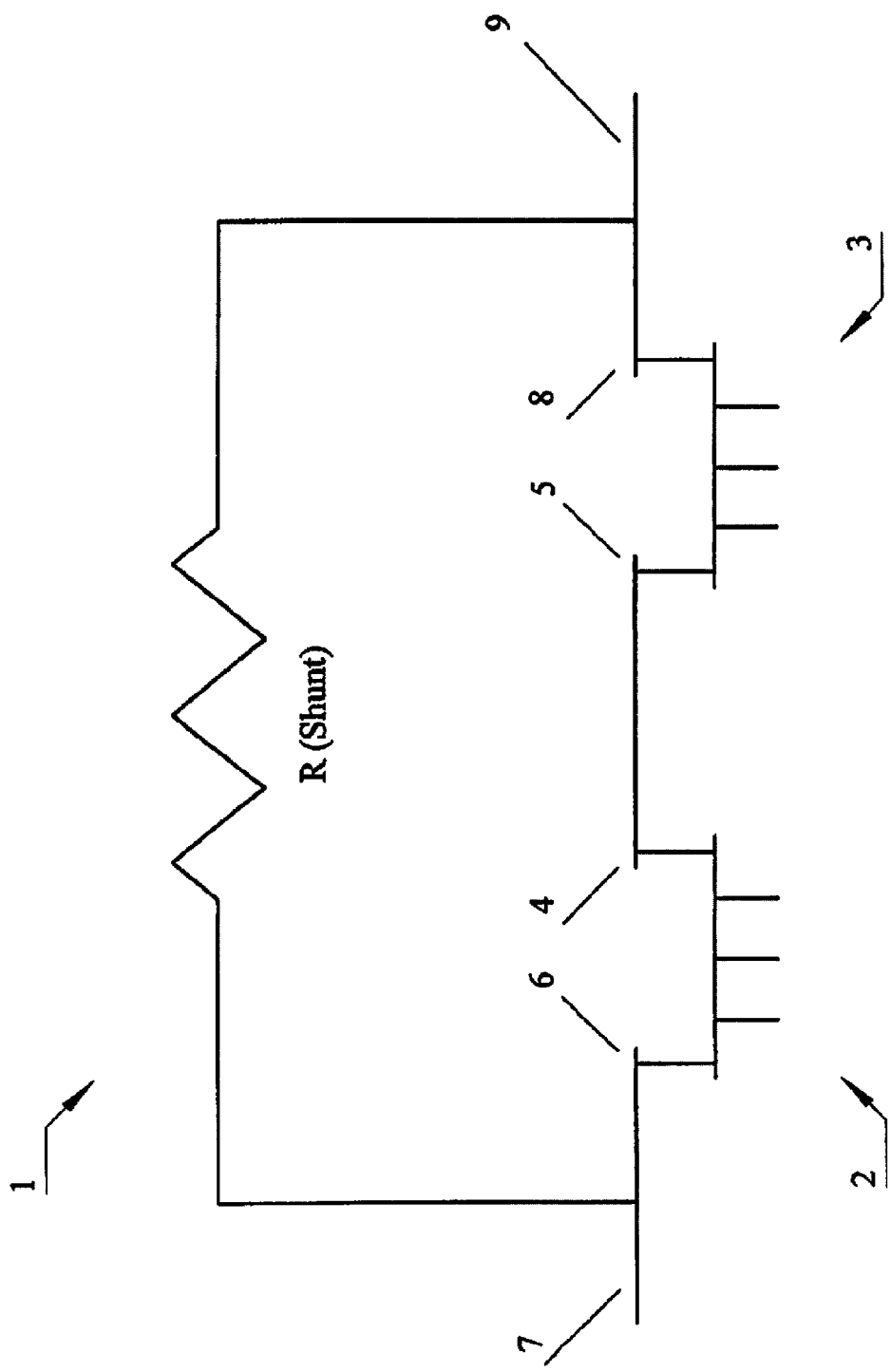

FIG. 1 shows, in schematic form, a known antenna switch arm 1. The antenna switch arm 1 comprises first and second field effect transistors 2, 3 connected in series with the drain 4 of one transistor 2 connected to the source 5 of the next. The source 6 of one transistor 2 is connected to a signal input port 3. The drain 8 of the other is connected to a signal output port 9. A shunt resistor 10 extends between the input and output ports 7, 9.

In the off configuration, the impedance between the ports 7, 9 is $R_{DS}$ in parallel with $C_{FET}$ (the off capacitance of the FETs) which is highly non linear. In the on configuration the $R_{DS}$ is shorted out.

Figure 2:
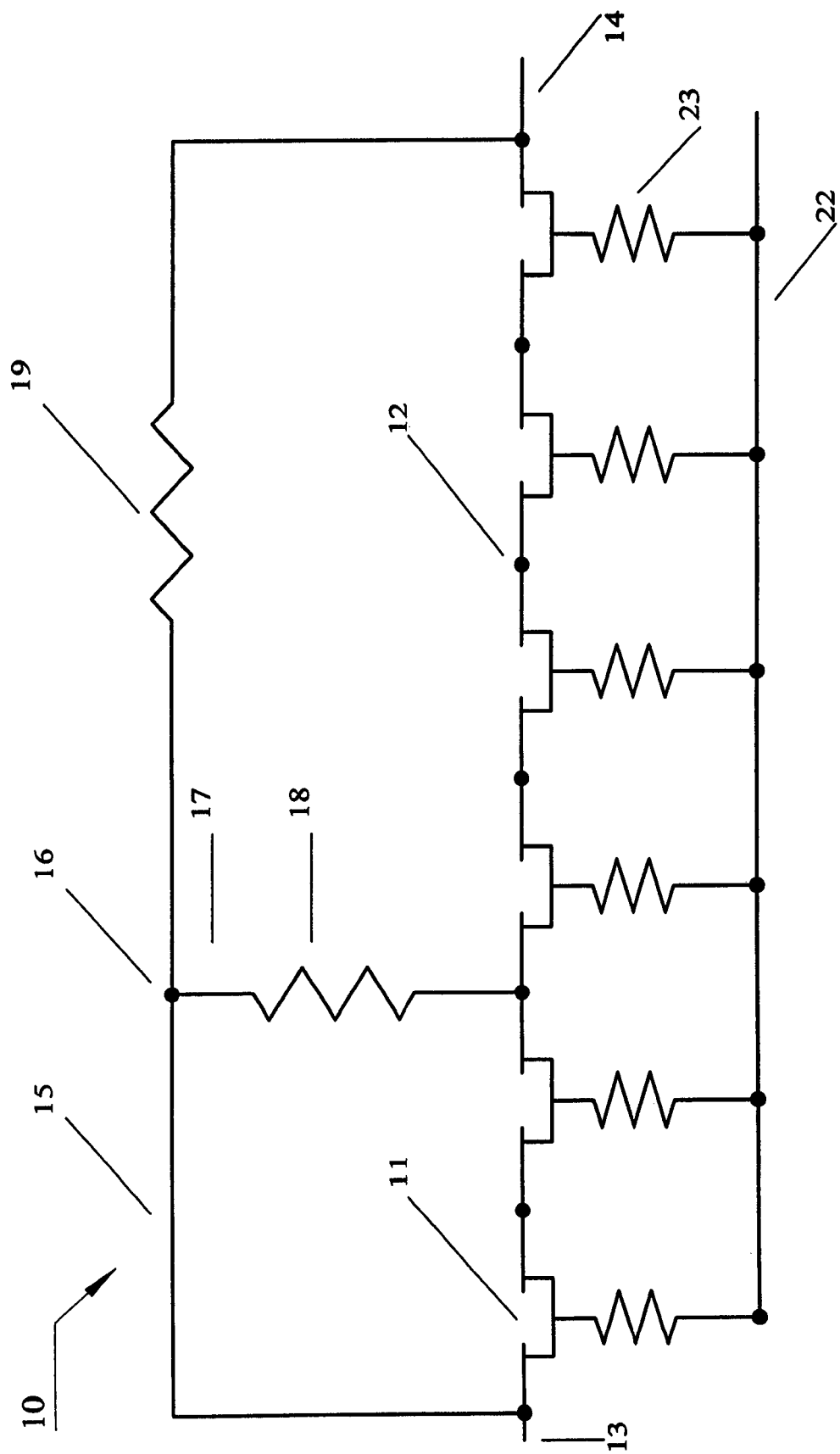
FIG. 2 shows a first embodiment of a linear antenna switch arm according to the invention.

Shown in FIG. 2 is a linear antenna switch arm 10 according to the invention. The arm 10 comprises a plurality of FETs 11 connected in series with the drain of one FET 11 being connected to the source of the next, the connections between the FETs being joins 12. The source of one end transistor 11 is connected to a signal input port 13. The drain of the other end transistor 11 is connected to a signal output port 14. A signal line 15 extends between the input and output ports 13, 14.

One of the joins 17 is connected to the signal line 15 at a node 16 by a connection line 17. The connection line 17 includes a resistor 18. The signal line 15 includes a resistor 19 between the node 16 and the output port 14.

In use the connection line 17 fixes the voltage at the join 12 with a high value resistor 18. This significantly improves the linearity of the linear antenna switch arm 10.

Figure 3:
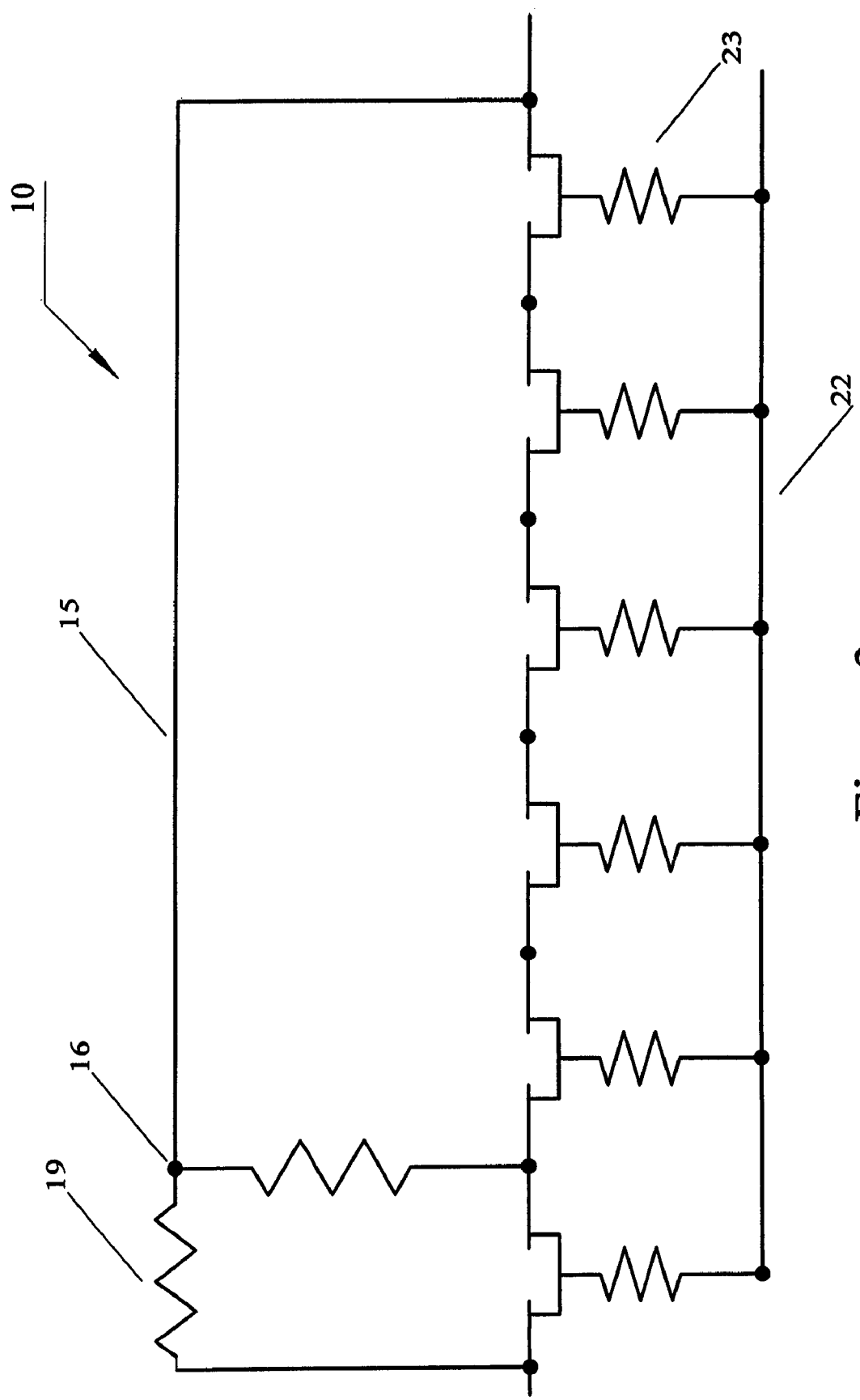
FIG. 3 shows a second embodiment of a linear antenna switch arm according to the invention.

Shown in FIG. 3 is a further embodiment of a linear antenna switch arm 10 according to the invention. This embodiment is similar to that of FIG. 2 except the resistor 19 in the signal line 15 is between the input port 13 and the node 16.

Figure 4:
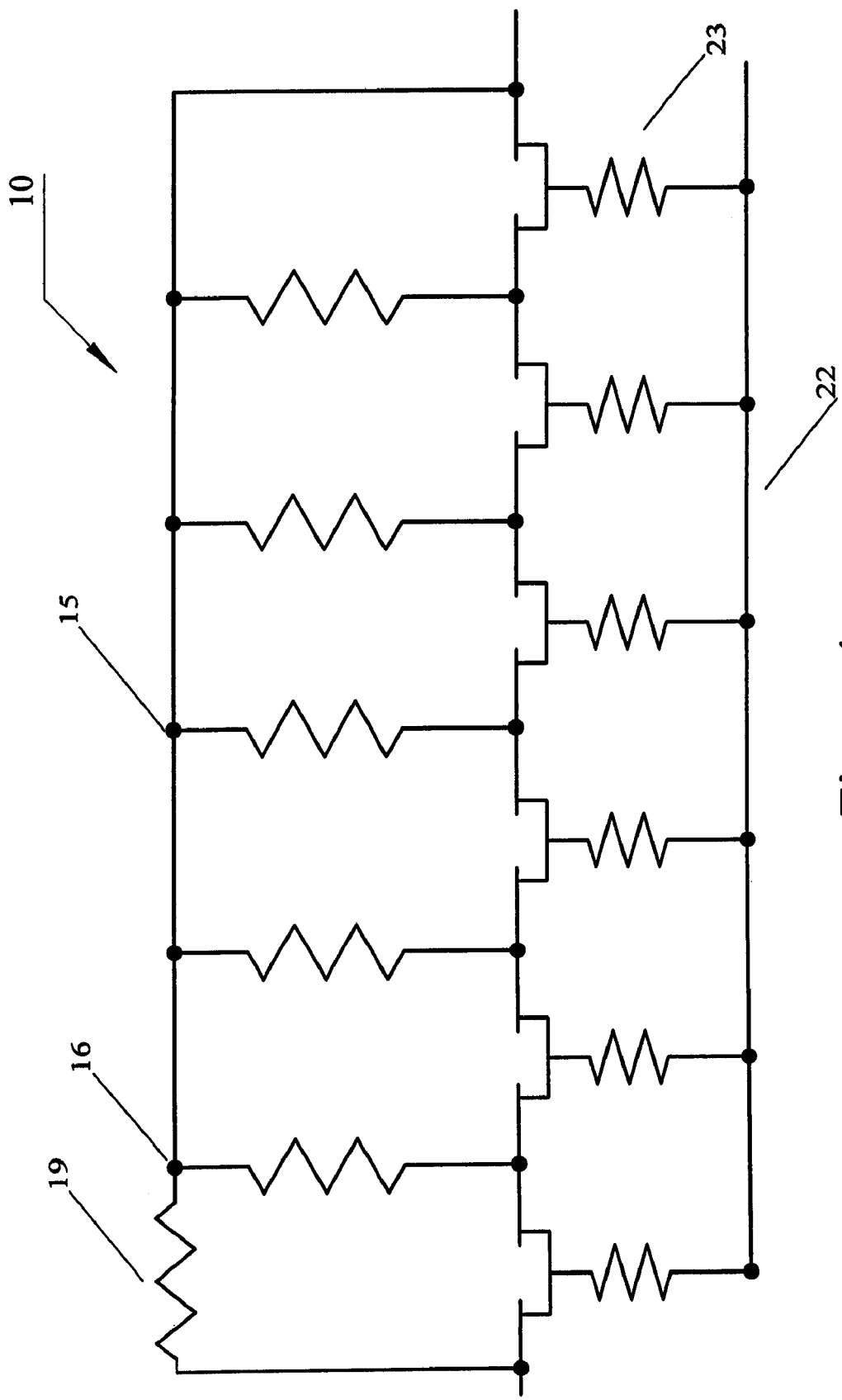
FIG. 4 shows a third embodiment of a linear antenna switch arm according to the invention.

Shown in FIG. 4 is a further embodiment of a linear antenna switch arm 10 according to the invention. In this embodiment a plurality of joins 12 are connected to the signal line 15 at nodes 16 by connection lines 17. Each connection line 17 includes a resistor 18. Resistors are not included in the signal line 15 between the nodes 16. The nodes 16 are essentially short circuited together by the signal line 15. Again, the connection lines 17 pin the voltages at the joins 12 so improving the linearity of the linear antenna switch arm 10.

Figure 5:
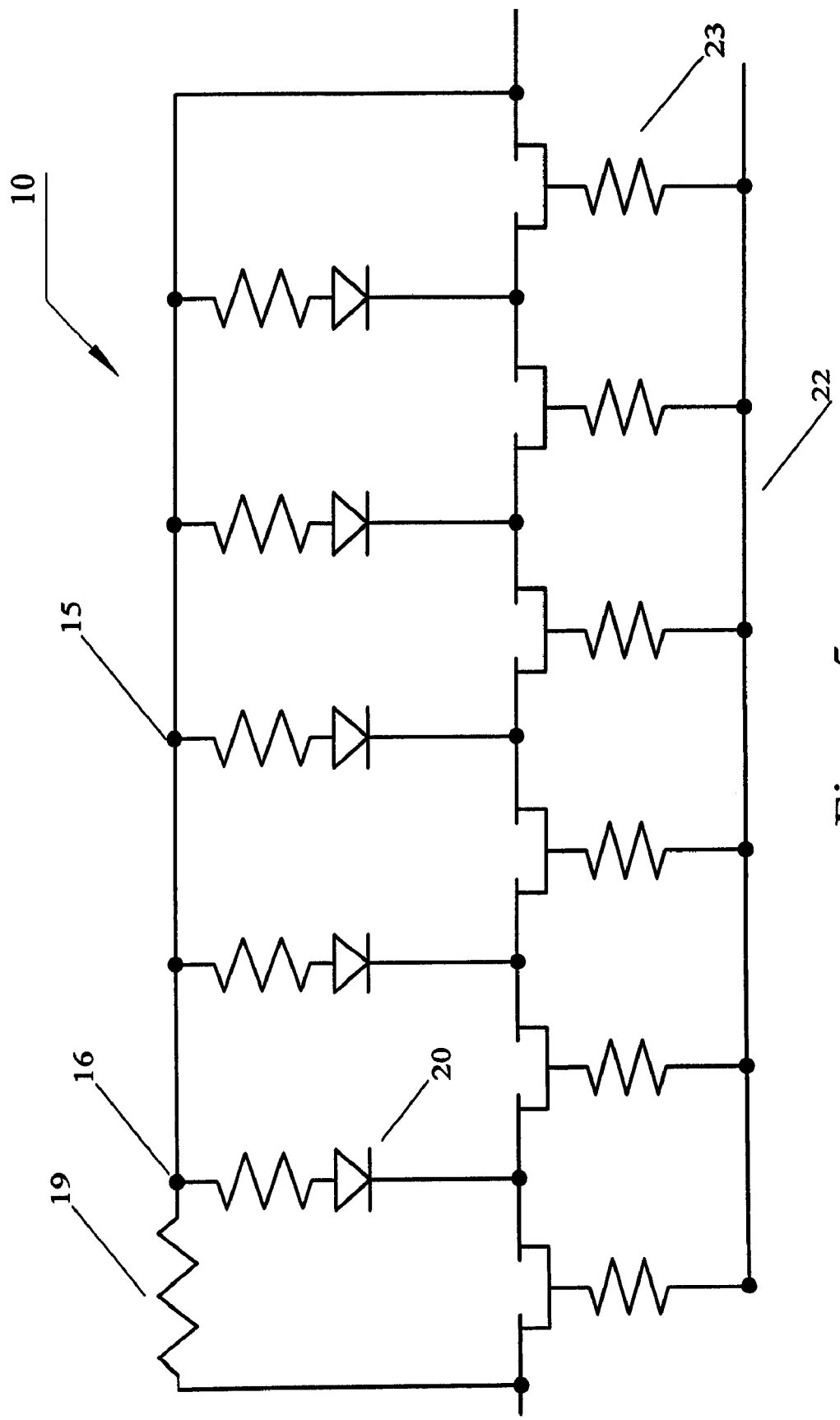
FIG. 5 shows a fourth embodiment of a linear antenna switch arm according to the invention.

Shown in FIG. 5 is a further embodiment of a linear antenna switch arm 10 according to the invention. This embodiment is similar to that of FIG. 4 except each of the connection lines 17 includes a diode 20 in addition to a resistor 18.

Figure 6:
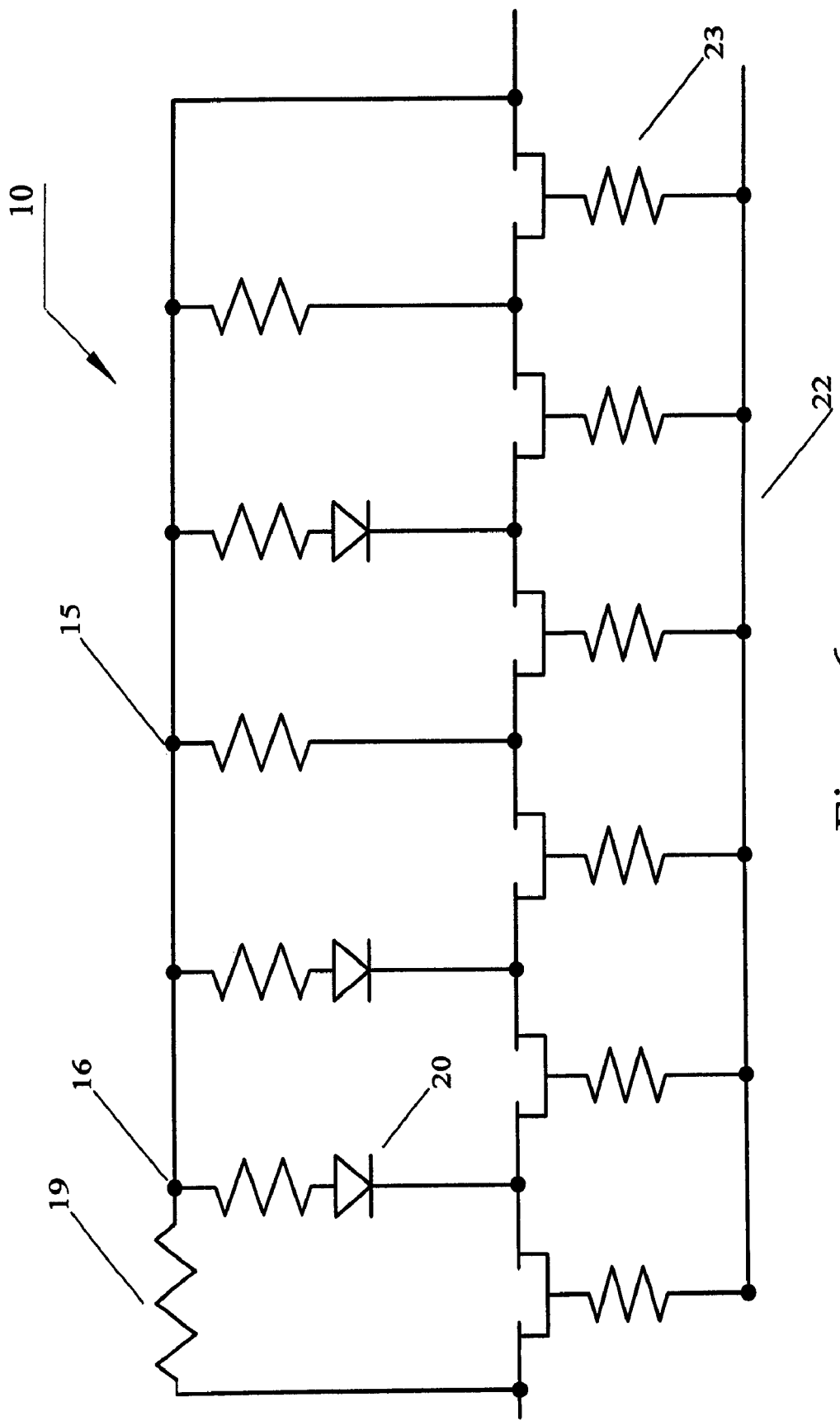
FIG. 6 shows a fifth embodiment of a linear antenna switch arm according to the invention.

Shown in FIG. 6 is a further embodiment of a linear antenna switch arm 10 according to the invention. This embodiment is similar to the embodiment of FIG. 5 except not all of the connection line 17 include a diode 20.

Figure 7:
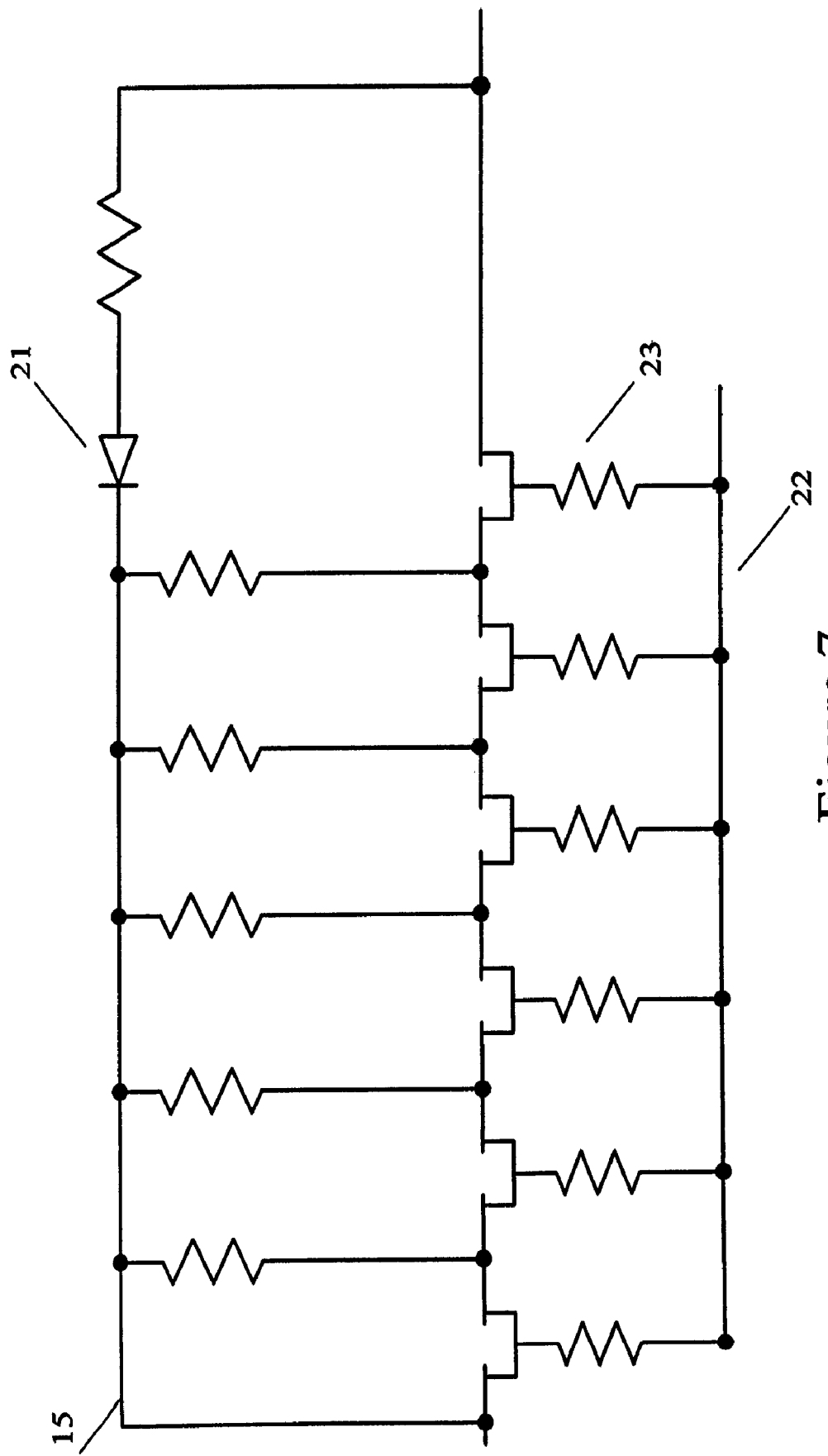
FIG. 7 shows a sixth embodiment of a linear antenna switch arm according to the invention.

Shown in FIG. 7 is a further embodiment of a linear antenna switch arm 10 according to the invention. This embodiment includes a diode 21 in the signal line.

In all of these embodiments the gates of the FETs 11 are connected to a control line 22 by resistors 23 for turning the FETs on and off.

The invention claimed is:

1. A linear antenna switch arm comprising:
   a plurality of field effect transistors connected in series, a drain of each transistor being connected to a source of the next transistor at a join, an end source comprising one of a signal input or output port and an end drain comprising a complementary signal output port or input port;
   a signal line extending between the input and output ports;
   at least one of the joins being connected to the signal line at a node by a connection line;
   the signal line comprising at least one resistor between signal input and output ports; and
   the connection line comprising at least one resistor.

2. A linear antenna switch arm as claimed in claim 1, wherein a plurality of joins are connected to the signal line at nodes by connection lines, each connection line including a resistor.

3. A linear antenna switch arm as claimed in claim 2, where adjacent nodes are electrically shorted together by the signal line.

4. A linear antenna switch arm as claimed in claim 1, wherein the signal line comprises a resistor between the signal input port and a first node in the signal line.

5. A linear antenna switch arm as claimed in claim 1, wherein the signal line comprises a resistor between the signal output port and a last node in the signal line.

6. A linear antenna switch arm as claimed in claim 1, wherein at least one of the connection lines comprises a diode.

7. A linear antenna switch arm as claimed in claim 1, wherein the signal line further comprises at least one diode.

8. A linear antenna switch arm as claimed in claim 1, wherein gates of the field effect transistors are connected to a control line by resistors.

9. A linear antenna switch arm as claimed in claim 3, wherein the signal line comprises a resistor between the signal input port and a first node in the signal line.

10. A linear antenna switch arm as claimed in claim 9, wherein the signal line comprises a resistor between the signal output port and a last node in the signal line.

11. A linear antenna switch arm as claimed in claim 4, wherein the signal line comprises a resistor between the signal output port and a last node in the signal line.

* * * * *